(12) United States Patent
Lee et al.

(10) Patent No.: US 7,842,450 B2
(45) Date of Patent: *Nov. 30, 2010

(54) METHOD OF FORMING A SEMICONDUCTOR DEVICE

(75) Inventors: Doo-youl Lee, Seoul (KR); Suk-joo Lee, Yongin-si (KR); Yool Kang, Yongin-si (KR); Han-ku Cho, Seongnam-si (KR); Chang-jin Kang, Seongnam-si (KR); Jae-ok Yoo, Suwon-si (KR); Sung-chan Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 410 days.

This patent is subject to a terminal disclaimer.

(21) Appl. No.: 11/711,781

(22) Filed: Feb. 28, 2007

(65) Prior Publication Data

US 2007/0287299 A1    Dec. 13, 2007

(30) Foreign Application Priority Data

Jun. 8, 2006    (KR) .................. 10-2006-0051383

(51) Int. Cl.
*G03F 7/00*    (2006.01)

(52) U.S. Cl. .................. 430/313; 430/314; 430/317; 430/311

(58) Field of Classification Search .................. None
See application file for complete search history.

(56) References Cited

U.S. PATENT DOCUMENTS

| | | | |
|---|---|---|---|
| 6,833,232 B2 | 12/2004 | Park | |
| 6,933,247 B2 | 8/2005 | Byun et al. | |
| 2004/0110099 A1 | 6/2004 | Kozawa et al. | |
| 2006/0216938 A1 | 9/2006 | Miyagawa et al. | |
| 2007/0077524 A1* | 4/2007 | Koh et al. .................. | 430/314 |

FOREIGN PATENT DOCUMENTS

| | | |
|---|---|---|
| JP | 2002-110654 | 4/2002 |
| JP | 2004-191465 | 7/2004 |
| KR | 10-1998-0030450 | 7/1998 |
| KR | 10-0225060 | 7/1999 |
| KR | 10-2003-0051000 A | 6/2003 |
| KR | 10-2004-0081865 A | 9/2004 |
| KR | 10-2006-0100251 | 9/2006 |
| KR | 10-2006-0100251 A | 9/2006 |

* cited by examiner

*Primary Examiner*—Daborah Chacko Davis
(74) *Attorney, Agent, or Firm*—Lee & Morse, P.C.

(57) ABSTRACT

A method of forming a semiconductor device includes forming a first mask pattern on a target layer, the first mask pattern exposing a first portion of the target layer, forming an intermediate material layer, including depositing an intermediate material layer film on a side of the first mask pattern and the first portion of the target layer, and thinning the intermediate material layer film to form the intermediate material layer, forming a second mask pattern that exposes a second portion of the intermediate material layer, removing the exposed second portion of the intermediate material layer to expose the target layer, and patterning the target layer using the first and second mask patterns as patterning masks.

18 Claims, 9 Drawing Sheets

FIG. 3L

METHOD OF FORMING A SEMICONDUCTOR DEVICE

BACKGROUND OF THE INVENTION

1. Field of the Invention

The present invention relates to a method of forming a semiconductor device. More particularly, the present invention relates to a method of forming a semiconductor device micropattern.

2. Description of the Related Art

Development of high performance and high-capacity semiconductor devices depends on technology for miniaturizing patterns of the semiconductor devices. The miniaturization of the patterns of the semiconductor devices depends largely on a photolithography process. Accordingly, extensive research has been conducted on the development of the photolithography process for forming micropatterns. As a result, various photolithography processes have been developed to form semiconductor micropatterns. For example, a light source, a stepper or a scanner, and a lens may be employed to effectively shorten a wavelength of light. Additionally, with respect to exposing technology, a phase shifting mask (PSM) process, an off axis illumination (OAI) process, and an immersion lithography process are also being studied and developed. However, advancing these technologies will require enormous research and development costs. Accordingly, there is a need for a process that allows quick easy, and stable formation of a micropattern.

SUMMARY OF THE INVENTION

The present invention is therefore directed to a method of forming a semiconductor device, which substantially overcomes one or more of the problems due to the limitations and disadvantages of the related art.

It is therefore a feature of an embodiment of the present invention to provide a method of forming a micropattern that includes forming an intermediate material layer on a first mask pattern, and forming a second mask pattern on the intermediate material layer.

It is therefore another feature of an embodiment of the present invention to provide a method of forming a micropattern that includes forming an intermediate material pattern to a predetermined width, the predetermined width corresponding to a feature width patterned into a target layer.

At least one of the above and other features and advantages of the present invention may be realized by providing a method of forming a semiconductor device including forming a first mask pattern on a target layer, the first mask pattern exposing a first portion of the target layer, forming an intermediate material layer, including depositing an intermediate material layer film on a side of the first mask pattern and the first portion of the target layer, and thinning the intermediate material layer film to form the intermediate material layer, forming a second mask pattern that exposes a second portion of the intermediate material layer, removing the exposed second portion of the intermediate material layer to expose the target layer, and patterning the target layer using the first and second mask patterns as patterning masks.

The first and second mask patterns may be photoresist patterns. The first and second mask patterns may include silicon. The intermediate material layer may include an inorganic material. The inorganic material layer may include silicon oxide. The intermediate material layer may include amorphous carbon.

Forming the second mask pattern on the intermediate material layer may include forming a mask layer that covers an upper portion of the intermediate material layer and covers the intermediate material layer that covers the first portion, and thinning the mask layer to expose the upper portion of the intermediate material layer. The method may further include forming an antireflection layer between the target layer and the first mask pattern. The antireflection layer may include an organic material. The target layer may include an inorganic hard mask.

At least one of the above and other features and advantages of the present invention may be realized by providing a method of forming a semiconductor device including forming a first mask pattern on a target layer, the first mask pattern exposing a first portion of the target layer, forming an intermediate material pattern, forming a second mask pattern that exposes portions of the intermediate material pattern, removing the exposed portions of the intermediate material pattern to expose a second portion of the target layer, and patterning the target layer using the first and second mask patterns as patterning masks, and wherein forming the intermediate material pattern includes depositing an intermediate material on a side of the first mask pattern and the first portion of the target layer, and thinning the intermediate material to form the intermediate material pattern.

The first and second mask patterns may include photoresist patterns. The first and second mask patterns may include silicon. Forming the intermediate material pattern may be repeated more than one cycle. Forming the intermediate material pattern may include a plasma process to selectively deposit and thin the intermediate material. The intermediate material may include a CF-based polymer.

Forming the second mask pattern may include forming a mask layer that covers the first mask pattern and an upper portion of the intermediate material pattern, and thinning the mask layer so that the upper portion of the intermediate material pattern is exposed. Removing the exposed portions of the intermediate material pattern may include a plasma process. The method may further include forming an antireflection layer between the target layer and the first mask pattern. The target layer may include an inorganic hard mask.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0051383, filed on Jun. 8, 2006, in the Korean Intellectual Property Office, and entitled: "Method of Forming Micropattern of Semiconductor Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and portions may be exaggerated for clarity of illustration. It will be understood that the profiles of features illustrated in the figures are exemplary and schematic, and may vary according to manufacturing techniques, tolerances and/or allowances, etc. Thus, embodiments of the invention are not limited to the illustrated profiles, and include changes and modifications thereto, e.g., those relating to variations in the manufacturing process. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
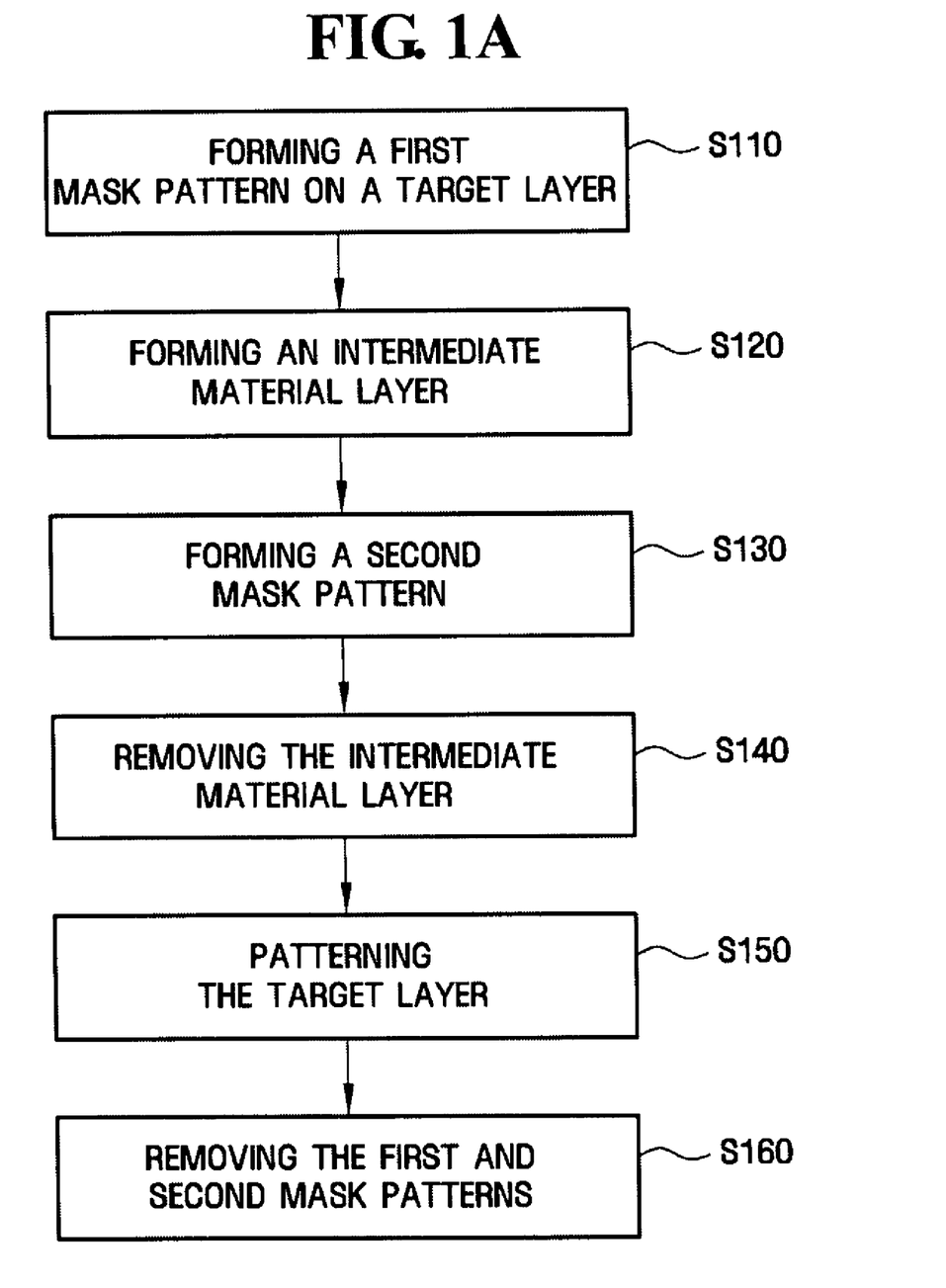
FIGS. 1A and 1B illustrate flowcharts of a method of forming a semiconductor device micropattern according to first and second embodiments of the present invention, respectively.
Figure 1B:
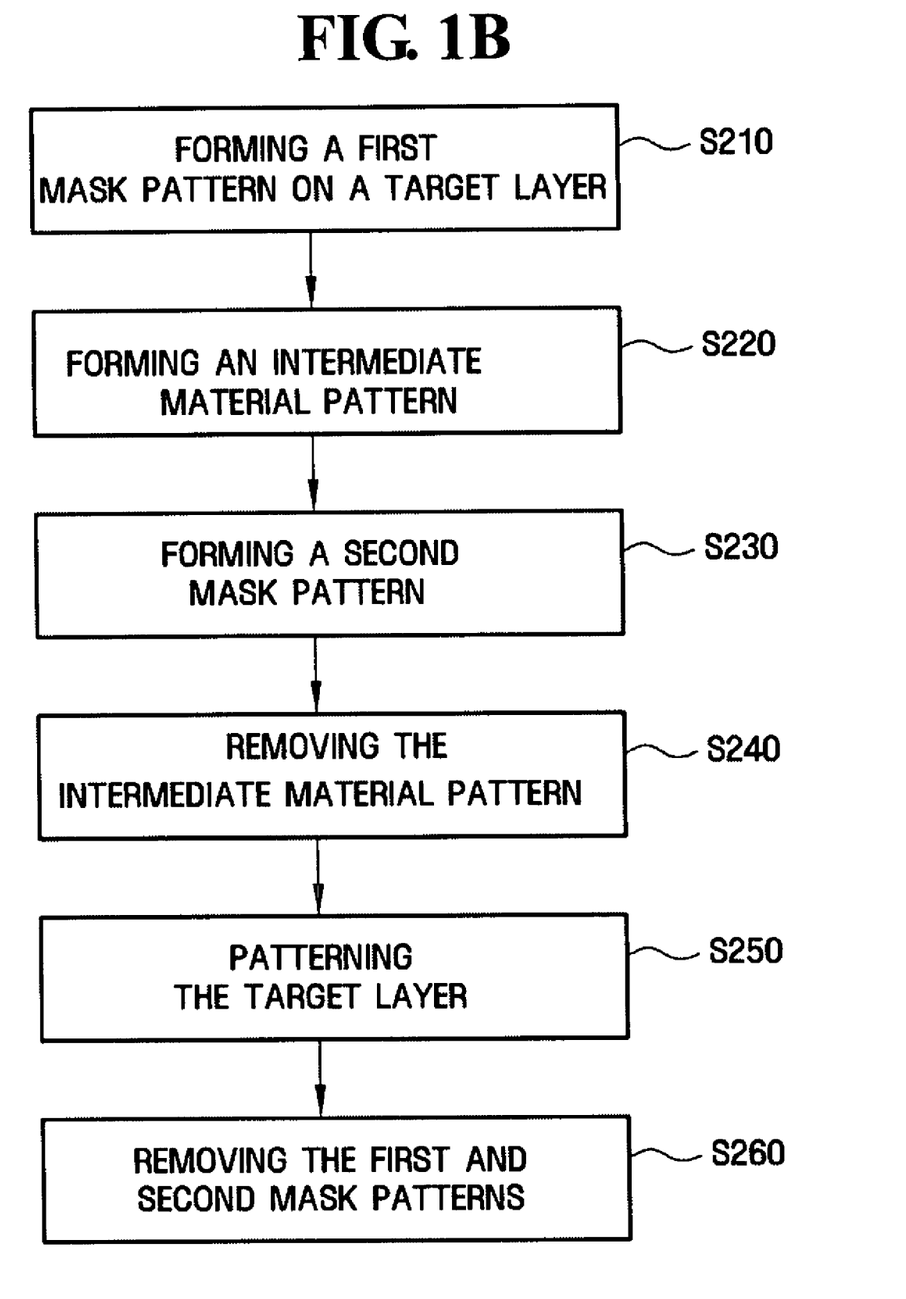

FIGS. 1A and 1B illustrate flowcharts of a method of forming a semiconductor device micropattern according to first and second embodiments of the present invention, respectively. With reference to FIG. 1A, the method according to the first embodiment of the present invention may include forming a first mask pattern on a target layer to be patterned (S110), forming an intermediate material layer on a surface of the first mask pattern (S120), forming a second mask pattern on the intermediate material layer (S130), removing a portion of the intermediate material layer (S140), patterning the target layer (S150), and removing the first and second mask patterns (160).

In detail, the method according to the first embodiment of the present invention may include forming the first mask pattern on the target layer, i.e., on a material layer to be patterned. More particularly, the target layer may be a lower material layer to be patterned using mask patterns, or a layer to be finally patterned. Further, the target layer may be another mask, e.g., a hard mask. The target layer may also be, e.g., a silicon substrate, a wafer, a conductive layer including polysilicon, metal silicide, or metal, a silicon oxide layer ($SiO_2$), a silicon nitride layer ($Si_3N_4$), a silicon oxy-nitride layer ($Si_xO_yN_z$) or other insulating layers, etc.

The first mask pattern may be, e.g., a photoresist pattern such as a silicon-containing photoresist, an organic photoresist, etc. The first mask pattern may be formed by, e.g., forming a photoresist layer on the target layer using coating, dispensing, lamination, etc., and exposing and developing the photoresist layer using a photolithography process to form the first mask pattern. The first mask pattern may selectively expose a portion of the target layer.

The intermediate material layer may be formed on a surface of the first mask pattern and on the exposed portion of the target layer. The intermediate material layer may include a material that has etching selectivity to the first mask pattern. In an implementation, the intermediate material layer may be formed of various organic or inorganic materials that do not contain silicon. Where the intermediate material layer includes an organic material, formation thereof may include, e.g., coating, dispensing, lamination, etc. Where the intermediate material layer includes an inorganic material, formation thereof may include, e.g., coating deposition, etc. In an implementation, a silicon oxide layer or an amorphous carbon layer may be formed, and the formation may be performed using physical deposition, chemical deposition, or atomic layer deposition.

The second mask pattern may be formed on the intermediate material layer so as to expose a portion of the intermediate material layer. In an implementation, the second mask pattern may be formed of the same material as the first mask pattern. When the second mask pattern is formed, a second mask layer may be formed and then partially removed. For example, the whole second mask layer may be thinned across the whole surface, e.g., using whole surface etching, whole surface ashing, or surface development after whole surface exposure, etc., to expose an upper part of the intermediate material layer.

After forming the second mask pattern, the partial removal of the intermediate material layer may be performed using, e.g., dry etching or wet etching, which may depend on the material of the intermediate material layer. Well-known methods exist for removing various types of materials that may be used for the intermediate material layer, and details thereof will not be repeated here. The partial removal of the intermediate material layer may include an anisotropic removal process. The anisotropic removal process may be stopped at the target layer.

Once the first and second mask patterns are formed and the intermediate material layer is partially removed to expose the target layer, the target layer may be patterned using the first mask pattern and the second mask pattern on the target layer as an etching mask. The first and second mask patterns may then be removed.

In an implementation (not shown), an antireflection layer may be formed between the target layer and the first mask pattern. For example, an organic antireflection layer or an inorganic antireflection layer may be selectively formed. An organic antireflection layer may be formed of, e.g., a same organic material as the intermediate material layer or the photoresist. An inorganic antireflection layer may be formed of, e.g., a same inorganic material as the intermediate material layer, or a silicon nitride layer or a silicon oxy-nitride layer. An organic antireflection layer may be patterned and removed using a method that is similar to the method used to pattern and remove organic materials such as the photoresist. An inorganic antireflection layer may be patterned and removed using a method that is similar to the method used to pattern and remove inorganic materials such as a silicon nitride layer. Accordingly, the method may be selected depending on characteristics of the process.

Additionally, a hard mask may be formed between the target layer and the first mask pattern. Where an antireflection layer is formed, the hard mask may be formed between the target layer and the antireflection layer. The hard mask may include, e.g., a silicon oxide layer, a silicon nitride layer, a silicon oxy-nitride layer, etc. The antireflection layer and the hard mask will be described in additional detail below in connection with FIGS. 2A to 2F.

Referring to FIG. 1B, the method according to the second embodiment of the present invention may include forming a first mask pattern on a target layer (S210), forming an intermediate material pattern, e.g., a polymer pattern, on a portion of the target layer exposed by the first mask pattern (S220), forming a second mask pattern that exposes portions of the intermediate material pattern (S230), removing the intermediate layer pattern (S240), patterning the target layer in accordance with the first and second mask patterns (S250), and removing the first and second mask patterns (S260). The target layer, and the first and second mask patterns, may be formed, patterned, and removed as described above in connection with the first embodiment. Additional details of formation of the polymer pattern will be described below in connection with FIGS. 3A to 3L.

FIGS. 2A to 2G illustrate cross-sectional views of stages in a method of forming a semiconductor device micropattern in accordance with the first embodiment of the present invention.

Figure 2A:
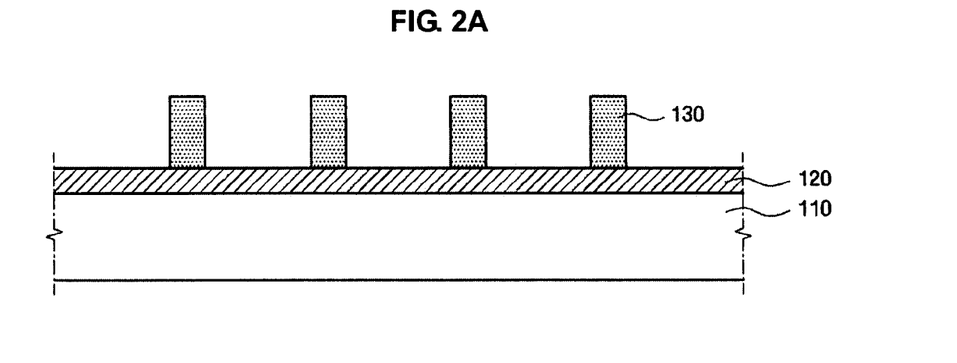
FIGS. 2A to 2G illustrate cross-sectional views of stages in a method of forming a semiconductor device micropattern in accordance with the first embodiment of the present invention.

Referring to FIG. 2A, a hard mask 120 may be formed on a target layer 110, i.e., on a lower material layer, and a first mask pattern 130 may be formed on the hard mask 120. It will be appreciated that the layer to be finally patterned may be the lower material layer, the hard mask layer, or another layer. Therefore, the layer to be finally patterned is generally referred to as the target layer, and may be a lower material layer, the hard mask layer illustrated in the drawings, another layer that is not shown, etc. In an implementation, the hard mask 120 may be omitted. Thus, it will be appreciated that the hard mask 120 is merely shown in order to illustrate the process in detail.

In detail, the target layer 110 may be a lower material layer to be patterned. The hard mask 120 may allow more finely patterning the target layer 110. In a typical patterning process, the target layer is etched using an etching mask to pattern a photoresist layer, e.g., an organic photoresist material. However, an organic photoresist may have poor etching selectivity with respect to the target layer. Thus, it may be difficult to finely pattern the target layer. Further, in order to assure desirable etching selectivity, it may be necessary to make the photoresist thick. However, it may be difficult to finely pattern the target layer when the thickness of the photoresist is increased. To avoid this, an inorganic material having an etching selectivity with respect to the target layer, i.e., an etching selectivity that is higher than the etching selectivity of the photoresist, may be used as the etching mask. In such a case, since the thickness of the photoresist may be reduced, finer patterning may be possible.

An antireflection layer (not shown) may also be formed on the hard mask 120. Details of such an antireflection layer are provided below in connection with FIGS. 3A to 3L. Accordingly, these details will not be repeated here. In connection with the first embodiment, only the first mask pattern 130 and a second mask pattern 150a, and an intermediate material layer pattern 140 are shown as being formed on the hard mask 120. However, it will be appreciated that the antireflection layer may be further formed on the hard mask 120. Alternatively, the antireflection layer may be directly formed on the target layer 110 while the hard mask 120 is omitted. It will be understood that the method according to the present invention may be applied to a case where only one of the antireflection layer and the hard mask 120 is formed, where both the antireflection layer and the hard mask 120 are formed, and where the antireflection layer and the hard mask 120 are omitted. For reference, a case where both an antireflection layer and a hard mask are formed is described below in connection with FIGS. 3A to 3L.

The first mask pattern 130 may be a photoresist pattern. In detail, a photoresist layer may be formed on the hard mask 120 and then subjected to a photolithography process to perform exposure and development, thereby forming the first mask pattern 130. An interval between adjacent features of the first mask pattern 130 may be wider than the ultimate interval between features formed in the target layer.

Conventionally, the interval between features in a mask pattern is the same as the interval between features formed in the target layer that is patterned. Moreover, the resolution of features formed in the target layer is limited by the corresponding resolution of features formed in the mask pattern, which is, in turn, limited by the constraints of the photolithography process used to form the mask pattern.

In contrast, according to the present invention, the interval between features in the first mask pattern 130 may be wider, e.g., three times wider, than the interval between the corresponding features that are ultimately formed in the target layer. Thus, since the interval between features in the first mask pattern 130 may be wider than the interval between corresponding features formed in the target layer, the first mask pattern 130 may be more easily and finely formed in comparison with the conventional case because the photolithographic process does not need to provide a resolution that directly corresponds to that of the ultimately-formed features.

The first mask pattern 130 may selectively expose a surface of the hard mask 120. In an implementation, the first mask pattern 130 may be a silicon-containing photoresist pattern, i.e., the first mask pattern 130 may be a pattern that is formed of a photoresist that includes silicon. Where the first mask pattern 130 contains silicon, if the intermediate material layer 140, which is to be formed during the subsequent process, is formed of an organic material, the first mask pattern 130 may have a desirable etching selectivity or ashing selectivity with respect to the intermediate material layer 140. Thus, in an implementation, the first mask pattern 130 may contain silicon and the intermediate material layer 140 may be formed of an organic material containing no silicon, or vice versa. For example, where the intermediate material layer 140 is formed of an inorganic material, the first mask pattern 130 may be a silicon-free material.

Figure 2B:
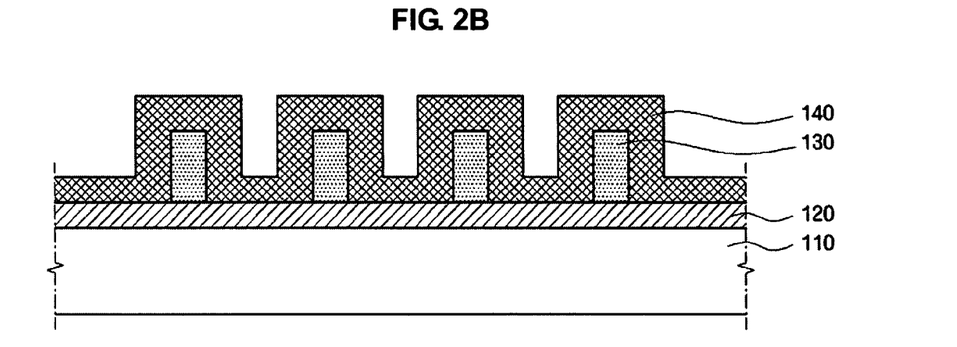

Referring to FIG. 2B, the intermediate material layer 140 may be formed on surfaces of the first mask pattern 130 and on the portions of the hard mask 120 that are exposed by the first mask pattern 130. The intermediate material layer 140 may be formed of organic material or inorganic material. If the intermediate material layer 140 is formed of organic material, the formation of the intermediate material layer 140 may be performed using coating, dispensing, lamination, etc. The intermediate material layer 140 may be formed of a photoresist or resin containing silicon. As described above, the intermediate material layer 140 may be formed of the organic material containing silicon whereas the first mask pattern 130 may not be. If the intermediate material layer 140 is formed of inorganic material, the formation may be performed using deposition, etc., according to the various types of materials that may be used. In an implementation, the intermediate material layer 140 may be a silicon oxide layer or an amorphous carbon layer, although various other suitable inorganic materials may be used depending on the particular manufacturing environment.

It may be desirable to use a material capable of being used in a low temperature process for the intermediate material layer 140. In particular, if the first mask pattern 130 is a photoresist, and if a high temperature process is performed, the first mask pattern 130 may be converted from a solid state to a viscous liquid state, thus losing shape. That is, it may be desirable to apply an inorganic material for the intermediate material layer 140 that is suitable for use at a temperature lower than a glass transition temperature (Tg) of the first mask pattern 130. It will be appreciated that the Tg will depend on the materials used for the first mask pattern 130, e.g., resin and/or additives therein, and that values for the Tg corresponding to various resins and additives are well known.

The first mask pattern 130 may contain silicon to increase the Tg. Where the intermediate material layer 140 is formed of inorganic material, if the first mask pattern 130 contains silicon, the Tg of the first mask pattern 130 may be increased. Thus, the formation of the intermediate material layer 140 may be performed using various processes.

In forming the intermediate material layer, to improve conformality, a silicon oxide layer may be deposited using an atomic layer deposition process. In another implementation, an amorphous carbon layer may be formed using a typical deposition process. However, it is not necessary to limit the thickness and the width of the inorganic material layer. The thickness and the width may depend on, e.g., the size of target material pattern to be formed, the limitations of the process, etc. In an implementation, the width and the thickness may be about the same as those of the first mask pattern 130. That is, the intermediate material layer 140 may be formed to have a same width as the first mask pattern 130 on the right and left sides of the features of the first mask pattern 130.

Figure 2C:
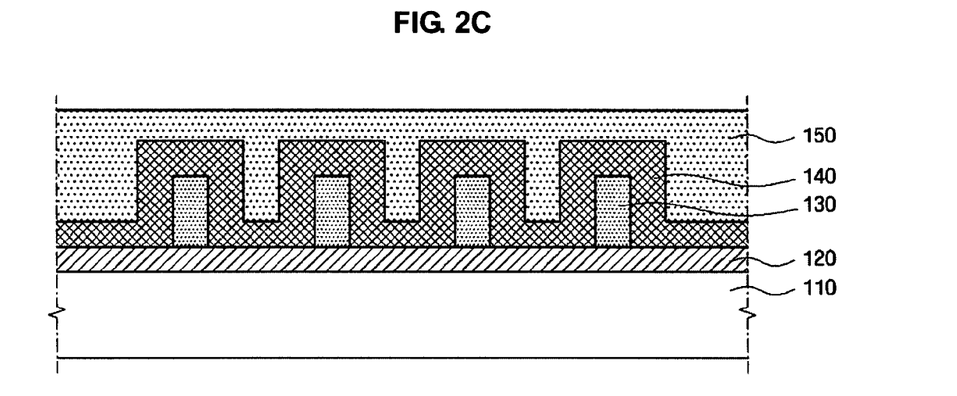

With reference to FIG. 2C, a mask layer 150 may be formed on a surface of the intermediate material layer pattern 140. The mask layer 150 may be formed of the same material as the first mask pattern 130, e.g., a photoresist containing silicon. However, as described above, where the intermediate material layer pattern 140 is formed of an organic material containing silicon, the mask layer 150 may be a photoresist free of silicon. The mask layer 150 may be formed using coating, dispensing, lamination, etc.

As illustrated in FIG. 2C, the mask layer 150 may be formed so that an upper part of the mask layer 150 is slightly higher than an upper part of the intermediate material layer 140, i.e., the mask layer 150 completely buries the intermediate material layer 140. In another implementation, the upper part of the mask layer 150 may be significantly higher than the upper part of the intermediate material layer 140, i.e., the mask layer 150 may be made thick. In still other implementations, the mask layer 150 may have the height similar to that of the intermediate material layer 140, or the upper part of the mask layer 150 may be slightly lower than the upper part of the intermediate material layer 140. In such a case, the mask layer 150 may be directly formed to have a pattern shape similar to that shown in FIG. 2D without additional processing.

Figure 2D:
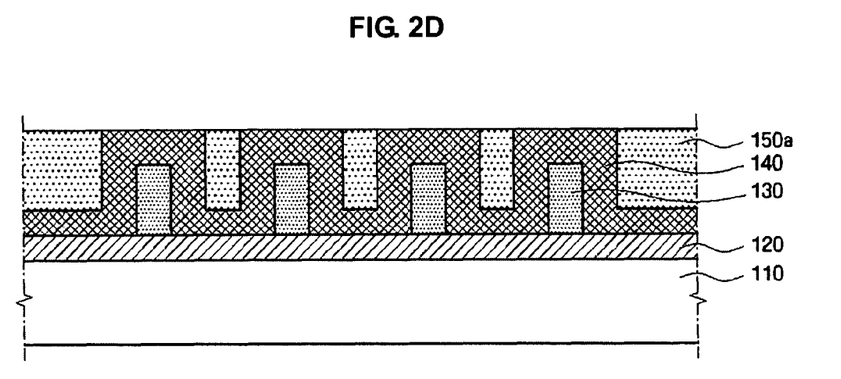

With reference to FIGS. 2C and 2D, a surface portion of the mask layer 150 may be partially removed to expose the upper part of the intermediate material layer 140. The removal of the surface portion of the mask layer 150 may be performed using, e.g., an ashing process, an etching process, and/or etc. Where the intermediate material layer 140 includes an organic material, an ashing process may be particularly suitable. The ashing process may include removal using, e.g., an $O_2$ plasma.

Where the intermediate material layer 140 includes an inorganic material, an etching process may be particularly suitable. The etching process may include removal using, e.g., gases including halogen group elements such as F, Cl, Br, etc. In an implementation, a wet etching process may be used. Removal may be performed using a developing solution for photoresist or an etching solution for wet etching. The developing solution for photoresist or the etching solution for wet etching may be a generally-known solution.

As described above, the upper part of the intermediate material layer 140 may not be exposed by the initially-formed mask layer 150, in which case the mask layer 150 may subsequently be partially removed to form a second mask pattern 150a that exposes upper parts of the intermediate material layer 140. Further, it will be appreciated that the above-described operations may be adapted to the case where the intermediate material layer 140 has a height that is similar to that of the mask layer 150, or where a portion of lateral sides, as well as the upper part, of the intermediate material layer pattern 140 are exposed. Further, although FIG. 2D shows the surface of the second mask pattern 150a and the surface of the intermediate material layer pattern 140 to be on a same level, the second mask pattern 150a may be higher or lower than the surface of the intermediate material layer 140.

In another implementation (not shown), the method may include forming a portion where the second mask pattern 150a is not present. In this case, the second mask pattern 150a may be used as a photoresist and the photolithography process may be selectively performed to form the portion where the second mask pattern 150a is not present. In detail, the photolithography process may be performed so that a portion where the second mask pattern 150a is to be formed is subjected to a photomasking process, and the portion where the second mask pattern 150a is not to be formed is not subjected to the photomasking process, but is exposed. Thus, the portion where the second mask pattern 150a is removed may be formed. Alternatively, if the second mask pattern 150a is formed on an entire surface of a processed structure, i.e., the intermediate material layer 140, a resin may be used instead of the photoresist. If only the resin is used, photosensitivity may not be assured unlike the photoresist.

Figure 2E:
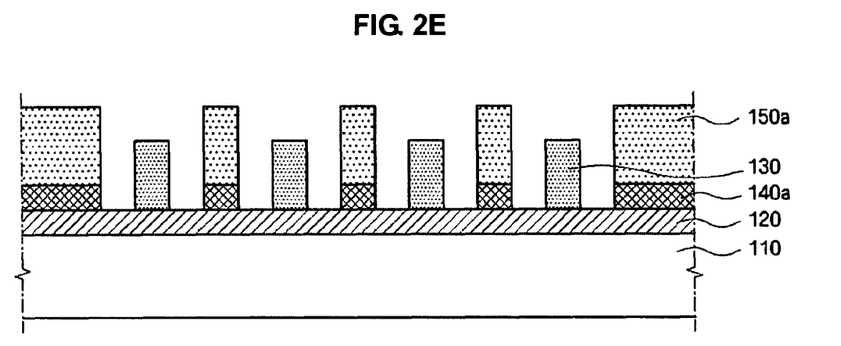

Referring to FIG. 2E, exposed portions of the intermediate material layer 140 may be removed to expose the underlying surface of the hard mask 120. Thus, the first and second mask patterns 130 and 150a remain, which enables selectively processing the surfaces of the hard mask 120 that are exposed by the removal of the intermediate material layer 140 between the first and second mask patterns 130 and 150a. In detail, the intermediate material layer 140 may be anisotropically etched to selectively expose the hard mask 120, leaving an intermediate material layer pattern 140a on which the second mask pattern 150a is disposed.

The selective removal of the intermediate material layer 140 may be performed using an ashing process using $O_2$ gas when an organic material is used for the intermediate material layer 140. In another implementation, a plasma etching process using gas including halogen group elements may be used when an inorganic material is used for the intermediate material layer 140.

The first and second mask patterns 130 and 150a may be maintained so as not to lose the original shape by forming these patterns with materials that have a suitable etching or ashing selectivity with respect to the intermediate material layer 140. Further, it will be appreciated that absolute selectivity is not required, and even if the first and second mask patterns 130 and 150a change from original shape during ashing or etching, the first and second mask patterns 130 and 150a may nonetheless have a suitable shape and thickness for use as an etching mask during patterning of the target layer 110 and/or the hard mask 120.

Figure 2F:
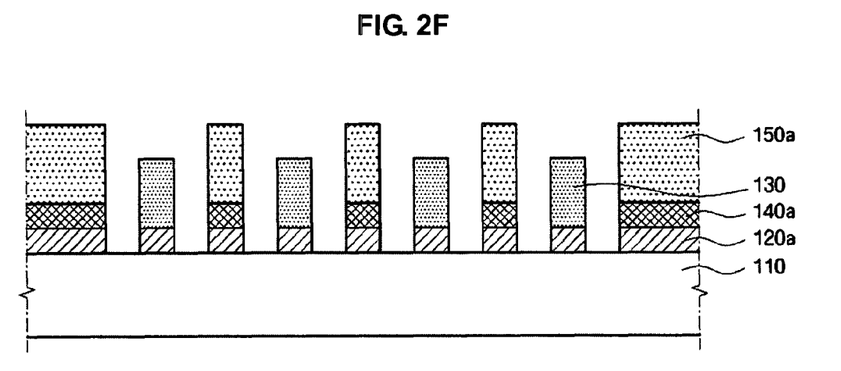

Referring to FIG. 2F, the first and second mask patterns 130 and 150a may be used as an etching mask to pattern the hard mask 120, thereby forming a hard mask pattern 120a. The hard mask pattern 120a may be formed using various processes according to the type of layer material. Such processes are well known, and thus details thereof will not be repeated here.

Figure 2G:
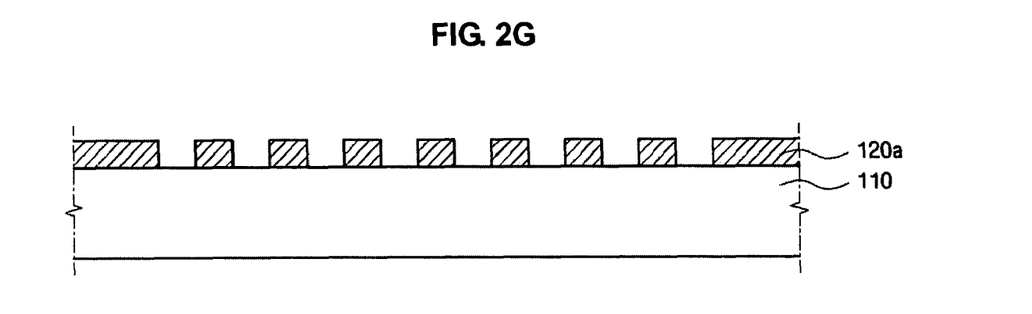

Referring to FIG. 2G, the first and second mask patterns 130 and 150a, as well as the intermediate material layer pattern 140a formed under the second mask pattern 150a, may be removed so that only the hard mask pattern 120a remains on the target layer 110. After the step shown in FIG.

2G, the target layer 110 may be additionally patterned using the hard mask pattern 120a, although, as described above, the hard mask pattern 120a may itself be the target layer. In an implementation (not shown), if a damascene process is to be performed, the hard mask pattern 120a may not be the hard mask but the final target layer. In another implementation (not shown), the first and second mask patterns 130 and 150a may be removed after the target layer 110 is patterned.

FIGS. 3A to 3L illustrate cross-sectional views of stages in a method of forming a semiconductor device micropattern in accordance with the second embodiment of the present invention. Elements and processes that may be substantially the same as those described above in connection with the first embodiment may be only briefly described, in order to avoid repetition.

Figure 3A:
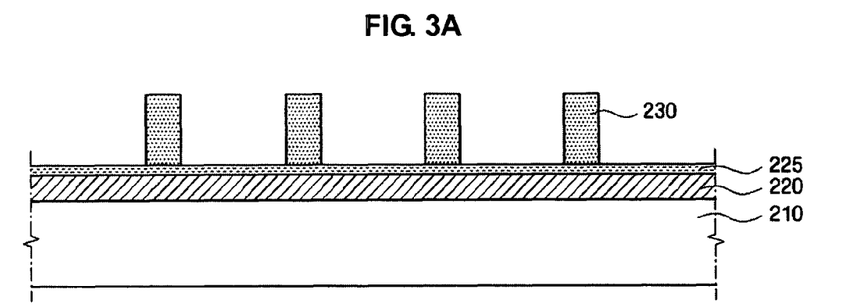
FIGS. 3A to 3L illustrate cross-sectional views of stages in a method of forming a semiconductor device micropattern in accordance with the second embodiment of the present invention.

Referring to FIG. 3A, a hard mask 220 and an antireflection layer 225 may be formed on a target layer 210, and a first mask pattern 230 may then be formed thereon. The description of the target layer 210, the hard mask 220, and the first mask pattern 230 may be understood referring to the description provided above in connection with FIG. 2A. The antireflection layer 225 may be formed to prevent light for exposure from reflecting from a surface of the hard mask 220 and/or a surface of the target layer 210, or from an interface therebetween, during a photolithography process, which may prevent undesirable exposure of the photoresist.

The antireflection layer 225 may include, e.g., an organic material or an inorganic material. Where an organic material is used, a resin that is identical to or different from the photoresist may be applied, e.g., by dispensing, coating, etc. Where an inorganic material is used, a silicon oxide layer, a silicon nitride layer, a silicon oxy-nitride layer, etc., may be deposited. The thickness of the antireflection layer 225 may depend on a wavelength of an exposure source and need not be constant. Determining the thickness of the antireflection layer 225 according to the wavelength of the exposure source is well known, and details of this determination will not be repeated here. As with the first embodiment, in the second embodiment the antireflection layer 225 may be omitted, both the hard mask 220 and the antireflection layer 225 may be omitted, etc.

Referring to FIGS. 3B-3I, an intermediate material pattern may be formed on the first mask pattern 230 and portions of the underlying layer that are exposed by the first mask pattern 230, which may be the antireflection layer 225, the hard mask 220 or the target layer 210. Formation of the intermediate material pattern may include depositing a first portion of a first material, e.g., a polymer, thinning the first portion of the first material, and depositing at least one additional portion of the first material on the thinned first portion. This operation may be adapted to include a number of addition/thinning cycles so as to build up the intermediate material pattern in a width, or lateral, direction.

Figure 3B:
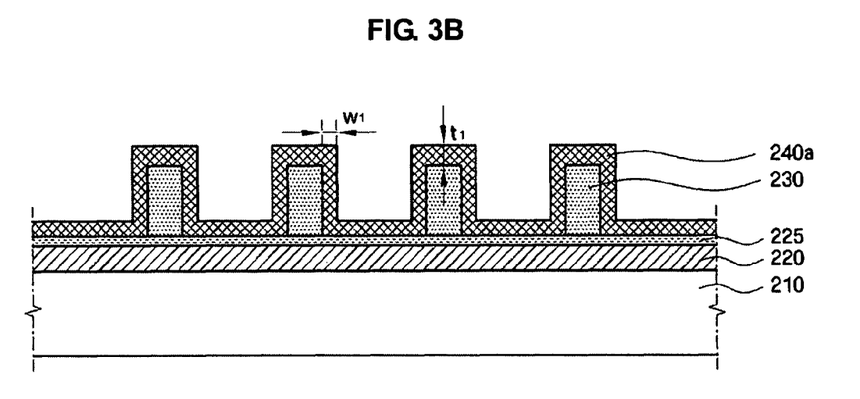

For example, in an implementation, a first polymer portion 240a having a first width (w1) and a first thickness (t1) may be formed on exposed surfaces of the first mask pattern 230 and the antireflection layer 225. The first polymer portion 240a may be, e.g., a CF-based polymer which may have a general formula $C_xF_y$, where x and y are positive integers of one or more. The first polymer portion 240a may not be chemically bonded to the exposed surfaces of the first mask pattern 230 and the antireflection layer 225, and may be deposited or precipitated.

In an implementation, a CF-based gas, e.g., a gas including C and F bonded to each other such as $CF_4$, $CHF_3$, $C_2F_6$, $C_3F_6$, and $C_4F_8$, or a combination of a gas including C and a gas including F such as $CO_2$ and $WF_6$, may be injected into a vacuum chamber, and then excited to form plasma, thereby forming the first polymer portion 240a. Alternatively, gases including C and F may be injected into a chamber for dry etching or deposition, and then excited to form plasma, thereby forming the first polymer portion 240a. Since the CF-based gas may be generally used to perform a dry etching process using plasma, it may be used in a vacuum chamber for dry etching.

According to this embodiment of the present invention, the process conditions of the dry etching process may be controlled to deposit the polymer on the first mask pattern 230, as well as to partially remove the polymer from the first mask pattern 230. Generally, the process conditions for dry etching include the type and the flow rate of injection gas, pressure and temperature in the chamber, density of the plasma, and DC and AC biases applied to the chamber. The above-mentioned conditions may be controlled to selectively apply and partially remove, or thin, the polymer.

In detail, the difference between the deposition of the polymer and the removal of the polymer may be controlled in part by controlling the amount of $O_2$ gas injected and the temperature of the processed structure, i.e., the temperature of the substrate wafer, which may be the first mask pattern 230 and/or the target layer 210. When little $O_2$ gas is injected during the process or when the temperature of the processed structure is reduced, the polymer may be deposited on the surface of the first mask pattern 230. Subsequently, the amount of $O_2$ gas injected and/or the temperature of the processed structure may be increased to partially remove the polymer from the surface of the first mask pattern 230. The deposition and the removal of the polymer may be repeated to form a profile where the polymer is deposited that has a desired shape, as illustrated in FIGS. 3B-3I.

It will be appreciated that the exact amount of $O_2$ gas injected may depend on the sizes of the process chamber and the processed structure, the type of process, the flow rate relative to other gases, etc. Broadly, the amount of $O_2$ gas used during the formation of the polymer may range up to about 10 times, or more, than the amount used during the removal of the polymer. In an implementation, the amount may be about 5 times more than the amount used during removal of the polymer. In another implementation, the amount may be freely controlled.

As described above, temperature may also be controlled to affect the deposition and/or removal rate of the polymer. The particular temperature range employed may depend on the nature of the substrate being treated, the equipment employed, etc. Generally, lower temperatures may produce better results. In an implementation, the range of temperature control may be up to about 200° C. or more, e.g., up to about 100° C.

Figure 3C:
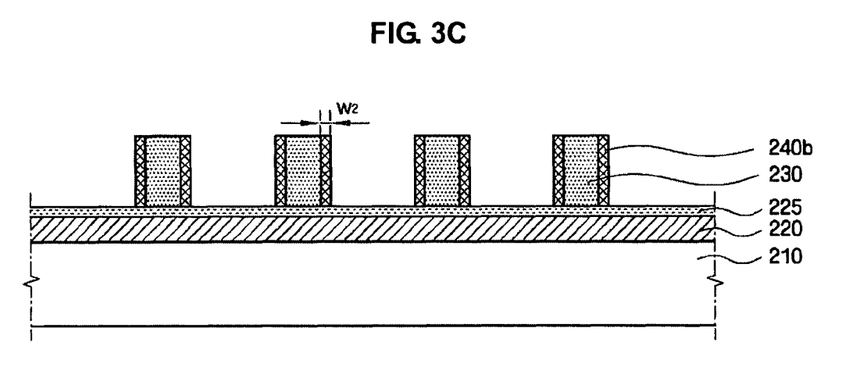

As illustrated in FIGS. 3B and 3C, the gas including C and F may be injected and used for the plasma process to form the first polymer portion 240a on the surface of the first mask pattern 230. Referring to FIG. 3C, the first polymer portion 240a may be partially removed to form a thinned polymer portion 240b having a second width (w2). That is, partial removal of the polymer may convert the first polymer portion 240a into the thinned polymer portion 240b. The second width (w2) may be less than the first width (w1). Thinning may remove the polymer from the upper surface of the first mask pattern 230 and the exposed surface of the antireflection layer 225, such that the thinned polymer portion 240b is formed alongside sidewalls of the first mask pattern 230.

In an anisotropic process, the polymer formed on a wall of the first mask pattern 230 may be removed in a relatively small amount, and the polymer formed on the upper part of the first mask pattern 230 and on the exposed surface of the antireflection layer 225 may be removed in a relatively large amount.

Figure 3D:
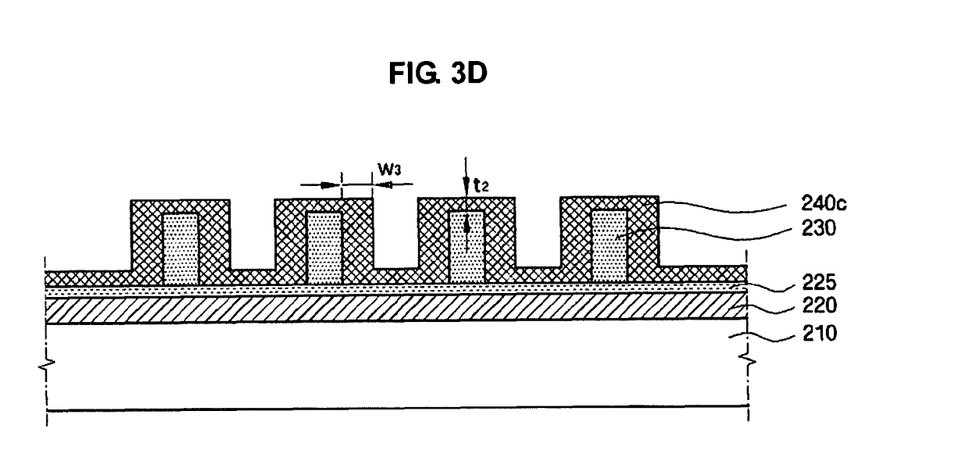

Referring to FIG. 3D, the polymer forming process may be repeated to deposit another polymer portion on the thinned polymer portion 240b, yielding a polymer pattern 240c having a third width (w3) and a second thickness (t2). In detail, the polymer pattern 240c having the third width (w3) that is thicker than the second width (w2) may be formed. The polymer may be formed to the second thickness (t2) on the upper part of the first mask pattern 230 and on the exposed surface of the antireflection layer 225. The third width (w3) may be greater than the first width (w1). The second thickness (t2) may not have a predetermined correlation to the first thickness (t1).

In an implementation (not shown), the preceding thinning operation may be modified to remove less polymer, such that the polymer remains on the upper part of the first mask pattern 240a and/or on the exposed surface of the antireflection layer 225. Thus, the other polymer portion may be formed on top of previously-formed polymer on the first mask pattern 230 and on the antireflection layer 225.

The above-described deposition and thinning operations may be repeated in order to precisely form an intermediate material pattern on the underlying layer. As described below, a second mask pattern 250 may be formed between the intermediate material pattern and the first mask pattern 230, and the first and second mask patterns 230 and 250 may be used to pattern the target layer 210 after removing the intermediate material pattern. Thus, the above-described deposition and thinning operations may be used to define a size of the second mask pattern 230, thereby enabling a high level of control and precision in patterning the target layer 210.

Figure 3E:
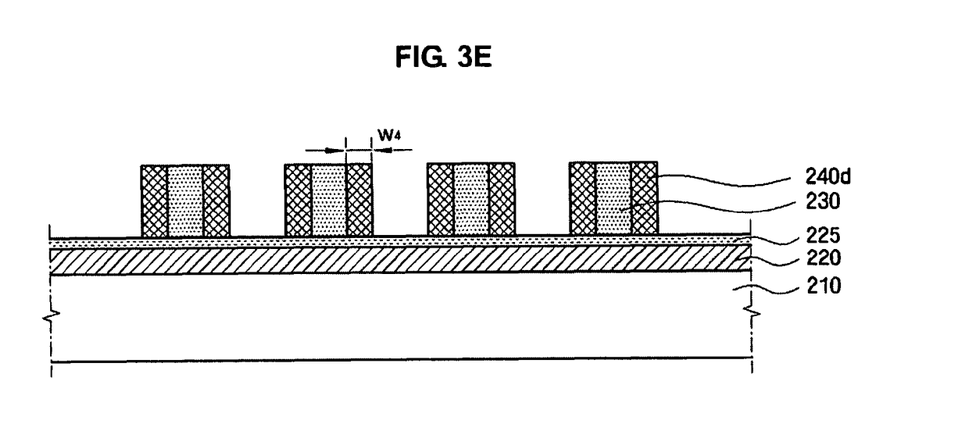

In detail, referring to FIG. 3E, the polymer removing process may be repeated to form a polymer pattern 240d having a fourth width (w4). This may be performed as described above in connection with FIG. 3C. In detail, the polymer that is formed on the upper part of the first mask pattern 230 and on the exposed surface of the antireflection layer 225 may be removed or made thin. The fourth width (w4) may be less than the third width (w3) and/or the fourth width (w4) may be greater than the second width (w2).

Figure 3F:
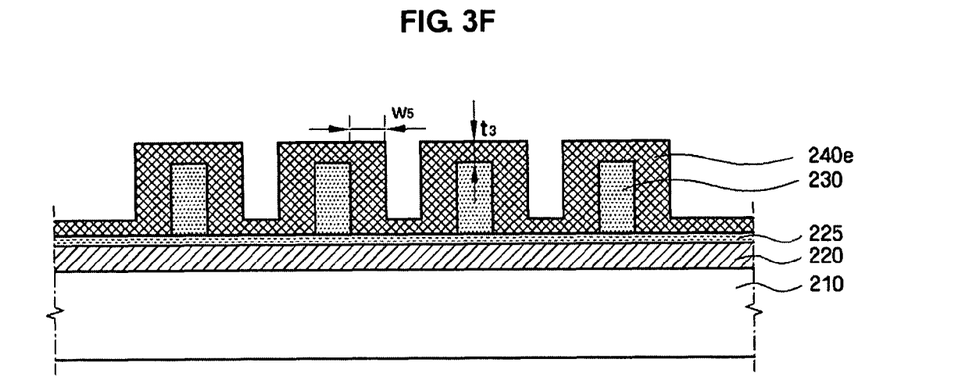

Referring to FIG. 3F, the polymer forming process may be repeated to form a polymer pattern 240e having a fifth width (w5) and a third thickness (t3). This may be performed as described above in connection with FIGS. 3B and 3D. The polymer may be formed to the third thickness (t3) on the surface of the first mask pattern 230 and on the exposed surface of the antireflection layer 225. The polymer may be formed to the fifth width (w5) on the wall of the first mask pattern 230. The fifth width (w5) may be greater than the third width (w3).

Figure 3G:
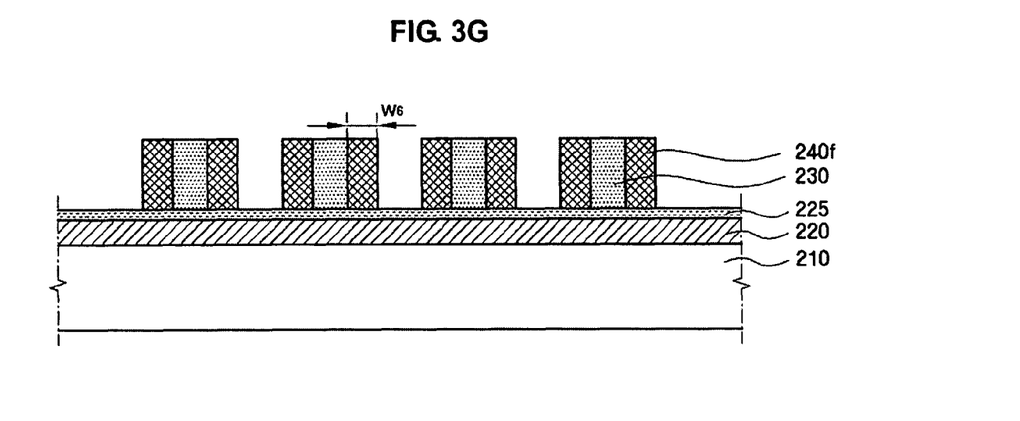

Referring to FIG. 3G, the polymer removing process may be repeated to form a polymer pattern 240f having a sixth width (w6). This may be performed as described above in connection with FIGS. 3C and 3E. The polymer that is formed on the upper part of the first mask pattern 230 and on the exposed surface of the antireflection layer 225 may be removed or made thin. The sixth width (w6) may be less than the fifth width (w5) and/or the sixth width (w6) may be greater than the fourth width (w4).

Figure 3H:
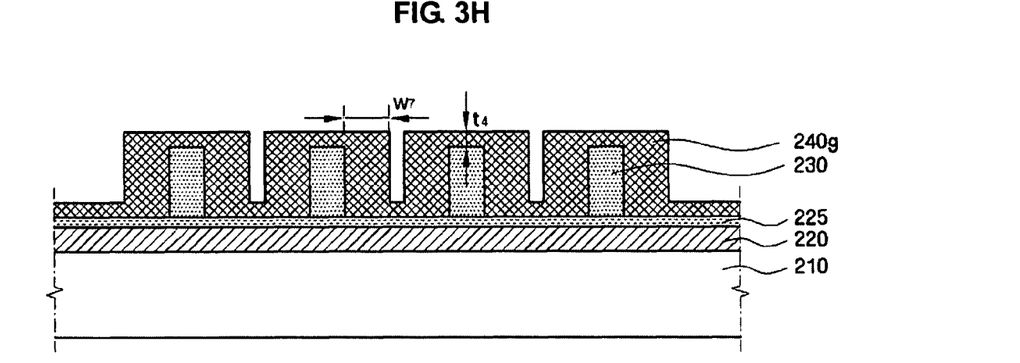

Referring to FIG. 3H, the polymer forming process may be repeated to form a polymer pattern 240g having a seventh width (w7) and a fourth thickness (t4). This may be performed as described above in connection with FIGS. 3B, 3D, and 3F. The seventh width (w7) may be greater than the fifth width (w5).

Figure 3I:
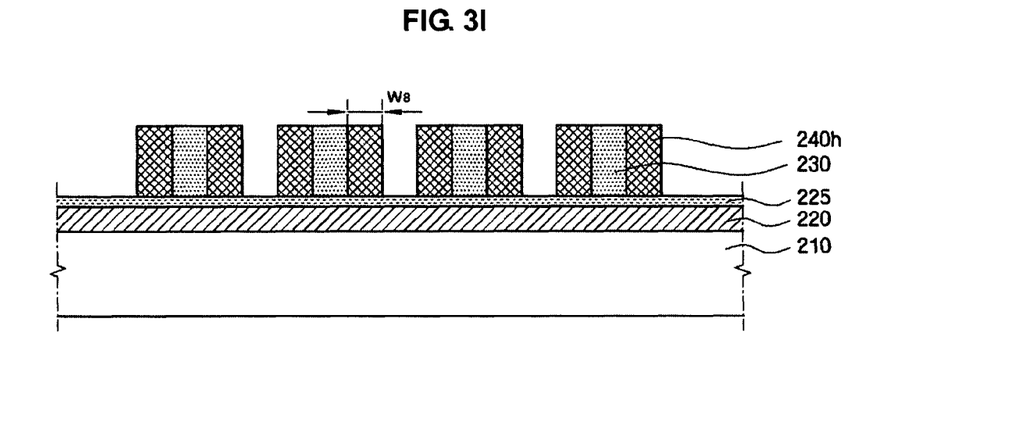

Referring to FIG. 3I, the polymer removing process may be repeated to form a polymer pattern 240h having an eighth width (w8). This may be performed as described above in connection with FIGS. 3C, 3E, and 3G. The eighth width (w8) may be smaller than the seventh width (w7) and/or the eighth width (w8) may be greater than the sixth width (w6). Assumedly, the eighth width (w8) may be a final thickness.

In an implementation, the eighth width (w8) may be similar to the width of the first mask pattern 230, and to the interval between the eighth polymer patterns 240h. It will be appreciated that an interval between features to be formed in the target layer corresponds to the size of the intermediate material pattern, in this case the polymer pattern. Accordingly, the eight width (w8) of the polymer pattern (240h) may be selected depending on various process considerations such as, e.g., the type of design, process capabilities, etc.

As described above, in an implementation, the deposition and thinning of a polymer may be repeated three times to form an intermediate material pattern. Of course, the deposition and the thinning cycles are not limited to three, and may be performed once, repeated a few times, or repeated tens of times. Furthermore, in the case in which an RF bias is used, since a (+) cycle and a (−) cycle may correspond to the deposition and the thinning (or vice versa), the repetition may be further controlled. In the case where the RF bias is used, the deposition cycle and the thinning cycle of the polymer may be set so that the cycle is biased to the (+) cycle or the (−) cycle based on the duration of the wave.

Figure 3J:
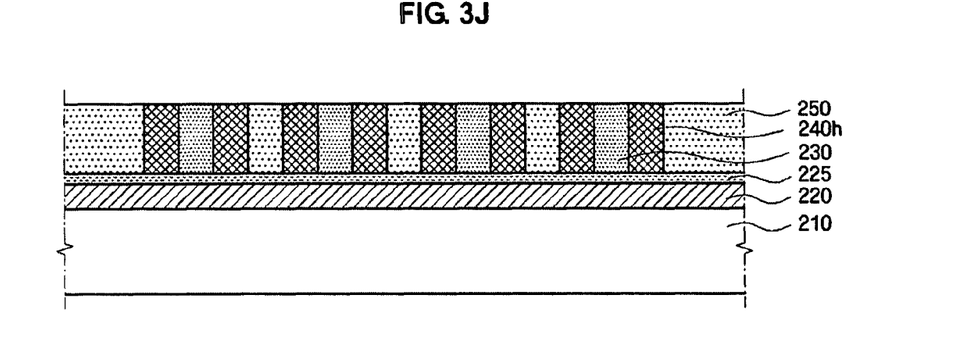

Referring to FIG. 3J, the second mask pattern 250 may be formed on exposed surfaces of the first mask pattern 230, the antireflection layer 225, and the polymer pattern 240h. In another implementation, the second mask pattern 250 may be selectively formed on the exposed surface of the antireflection layer 225 and on the wall of the polymer pattern 240h. That is, the second mask pattern 250 may not be formed on the upper parts of the first mask pattern 230 and the polymer pattern 240h.

Similar to the operations described above in connection with FIG. 2C, a mask layer may be formed and patterned to form the second mask pattern 250. In detail, after the mask layer (not shown) is formed to cover the exposed surfaces of the first mask pattern 230, the polymer pattern 240h, and the antireflection layer 225, the entire surface of the mask layer may be removed or made thin to produce the second mask pattern 250 having a profile shown in FIG. 3J. The thinning or removal of the surface of the second mask pattern 250 may expose the upper parts of the first mask pattern 230 and the polymer pattern 240h. The second mask pattern 250 may be the same photoresist as the first mask pattern 230. The second mask pattern may include silicon.

Figure 3K:
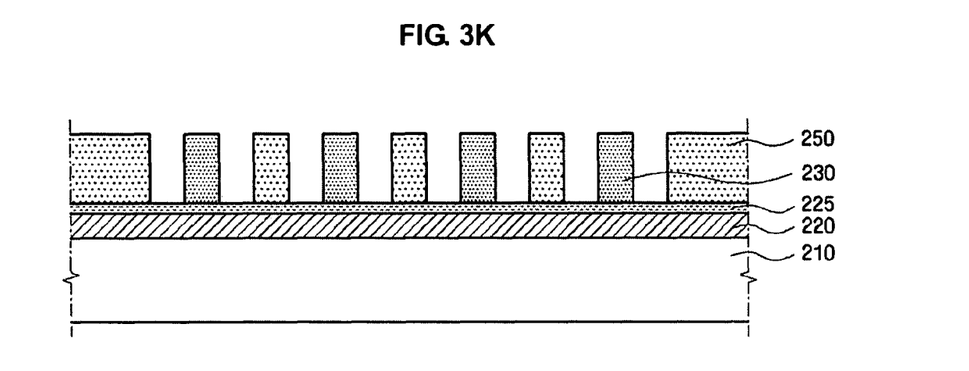

Referring to FIG. 3K, the polymer pattern 240h may be removed. That is, the polymer pattern 240h may be removed from the exposed upper part of the polymer pattern 240h down to the surface of the antireflection layer 225, thereby exposing the surface of the antireflection layer 225.

The process for removing the polymer pattern 240h may be an anisotropic process, an ashing process, etc. A CF-based polymer may be subjected to an ashing process using $O_2$ gas, thereby being easily removed. In connection with this, in the case of when the first and second mask patterns 230 and 250 are photoresist, the first and second mask patterns 230 and 250 may include silicon so as to have CF ashing selectivity.

Figure 3L:
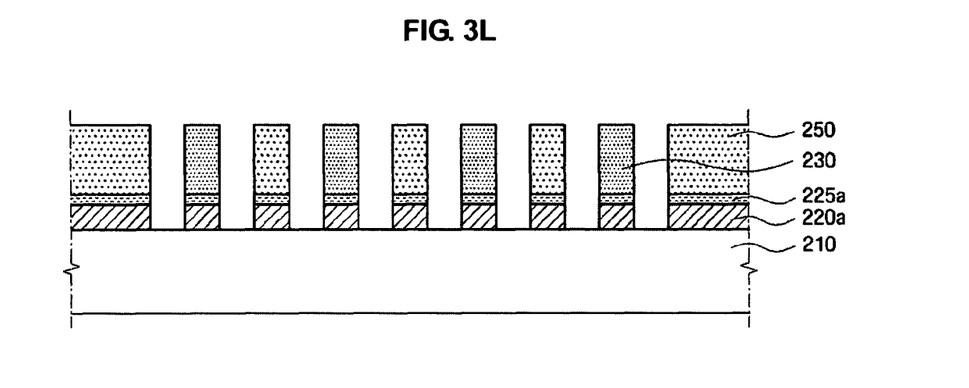

Referring to FIG. 3L, the antireflection layer 225 and the hard mask 220 may be patterned using the first mask pattern 230 and the second mask pattern 250 as masks. Where the antireflection layer 225 is formed of an organic material, the patterning may be performed using the ashing process used for removing the polymer 240h, as described in connection with FIG. 3K. Patterning may be performed using a separate process of patterning the antireflection layer 225. Where the antireflection layer 225 is formed of an inorganic material, the patterning may be performed using an etching process. Where the antireflection layer 225 is formed of an inorganic material, the process of patterning the antireflection layer 225 and the process of patterning the hard mask 220 may be performed in situ. That is, the processes may be continuously performed. The processes of patterning the antireflection layer 225 and the hard mask 220 have been described above in detail, thus the description thereof will not be repeated.

The first and second mask patterns 230 and 250 may be completely removed to leave a target layer pattern. The target layer pattern may be a pattern that includes one or more of the antireflection layer pattern 225a, the hard mask pattern 220a, and a pattern in the target layer 210. The process of removing the first and second mask patterns 230 and 250 may be performed as described above in connection with FIG. 2G.

As described above, in the methods of forming the micropattern of the semiconductor device according to embodiments of the present invention, it may be possible to form a high-resolution micropattern without the need for next-generation exposing equipment. Accordingly, it may be possible to economically and rapidly develop and produce semiconductor devices having high performance and high capacity.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
    forming a first mask pattern on a target layer, the first mask pattern exposing a first portion of the target layer;
    forming an intermediate material layer pattern, including:
        depositing an intermediate material layer film on a side of the first mask pattern and the first portion of the target layer; and
        thinning the intermediate material layer film to form the intermediate material layer pattern;
    forming a second mask pattern that exposes a second portion of the intermediate material layer pattern;
    removing the exposed second portion of the intermediate material layer pattern to expose the target layer; and
    patterning the target layer using the first and second mask patterns as patterning masks, wherein:
    the first and second mask patterns are photoresist patterns.

2. The method as claimed in claim 1, wherein the first and second mask patterns comprise silicon.

3. The method as claimed in claim 1, wherein the intermediate material layer pattern comprises an inorganic material.

4. The method as claimed in claim 3, wherein the inorganic material layer comprises silicon oxide.

5. The method as claimed in claim 1, wherein the intermediate material layer pattern comprises amorphous carbon.

6. The method as claimed in claim 1, wherein forming the second mask pattern on the intermediate material layer pattern comprises:
    forming a mask layer that covers an upper portion of the intermediate material layer pattern and covers the intermediate layer that covers the first portion; and
    thinning the mask layer to expose the upper portion of the intermediate material layer pattern.

7. The method as claimed in claim 1, further comprising forming an antireflection layer between the target layer and the first mask pattern.

8. The method as claimed in claim 7, wherein the antireflection layer comprises an organic material.

9. The method as claimed in claim 1, wherein the target layer comprises an inorganic hard mask.

10. A method of forming a semiconductor device, comprising:
    forming a first mask pattern on a target layer, the first mask pattern exposing a first portion of the target layer;
    forming an intermediate material pattern;
    forming a second mask pattern that exposes portions of the intermediate material pattern;
    removing the exposed portions of the intermediate material pattern to expose a second portion of the target layer; and
    patterning the target layer using the first and second mask patterns as patterning masks; and
    wherein forming the intermediate material pattern includes:
        depositing an intermediate material on a side of the first mask pattern and the first portion of the target layer, and
        thinning the intermediate material to form the intermediate material pattern, and
    forming the intermediate material pattern is repeated more than one cycle.

11. The method as claimed in claim 10, wherein the first and second mask patterns comprise photoresist patterns.

12. The method as claimed in claim 10, wherein the first and second mask patterns comprise silicon.

13. The method as claimed in claim 10, wherein forming the intermediate material pattern comprises a plasma process to selectively deposit and thin the intermediate material.

14. The method as claimed in claim 10, wherein the intermediate material comprises a CF-based polymer.

15. The method as claimed in claim 10, wherein forming the second mask pattern comprises:
    forming a mask layer that covers the first mask pattern and an upper portion of the intermediate material pattern; and
    thinning the mask layer so that the upper portion of the intermediate material pattern is exposed.

16. The method as claimed in claim 10, wherein removing the exposed portions of the intermediate material pattern comprises a plasma process.

17. The method as claimed in claim 10, further comprising forming an antireflection layer between the target layer and the first mask pattern.

18. The method as claimed in claim 10, wherein the target layer comprises an inorganic hard mask.

* * * * *